United States Patent
Bucki et al.

(10) Patent No.: US 7,225,422 B2
(45) Date of Patent: May 29, 2007

(54) WIRE TRIMMED PROGRAMMABLE LOGIC ARRAY

(75) Inventors: Robert John Bucki, Cary, NC (US); Sang Hoo Dhong, Austin, TX (US); Joel Abraham Silberman, Somers, NY (US); Osamu Takahashi, Round Rock, TX (US)

(73) Assignee: International Business Machines Corporation, Armonk, NY (US)

( * ) Notice: Subject to any disclaimer, the term of this patent is extended or adjusted under 35 U.S.C. 154(b) by 712 days.

(21) Appl. No.: 10/464,879

(22) Filed: Jun. 19, 2003

(65) Prior Publication Data

US 2004/0261048 A1    Dec. 23, 2004

(51) Int. Cl.
*G06F 17/50* (2006.01)
(52) U.S. Cl. .......................................... 716/14; 716/16
(58) Field of Classification Search ............ 716/13–14, 716/16–17
See application file for complete search history.

(56) References Cited

U.S. PATENT DOCUMENTS

| | | | | |
|---|---|---|---|---|
| 5,212,652 A | * | 5/1993 | Agrawal et al. | 326/41 |
| 5,381,343 A | * | 1/1995 | Bamji et al. | 716/2 |
| 5,436,576 A | * | 7/1995 | Hibdon et al. | 326/47 |
| 5,519,629 A | * | 5/1996 | Snider | 716/17 |
| 5,760,604 A | * | 6/1998 | Pierce et al. | 326/41 |
| 5,914,616 A | * | 6/1999 | Young et al. | 326/41 |
| 5,942,913 A | * | 8/1999 | Young et al. | 326/41 |
| 6,157,214 A | * | 12/2000 | Marshall | 326/41 |
| 6,216,257 B1 | * | 4/2001 | Agrawal et al. | 716/16 |
| 6,285,218 B1 | * | 9/2001 | Dhong et al. | 326/112 |
| 6,467,073 B1 | * | 10/2002 | Merchant | 716/16 |
| 6,501,297 B1 | * | 12/2002 | Kong | 326/41 |
| 6,631,510 B1 | * | 10/2003 | Betz et al. | 716/16 |
| 6,895,570 B2 | * | 5/2005 | Lewis et al. | 716/16 |
| 7,058,919 B1 | * | 6/2006 | Young et al. | 716/12 |
| 2001/0007428 A1 | * | 7/2001 | Young et al. | 326/41 |
| 2002/0008541 A1 | * | 1/2002 | Young et al. | 326/41 |
| 2002/0166106 A1 | * | 11/2002 | Lewis et al. | 716/16 |
| 2002/0178431 A1 | * | 11/2002 | Chapman et al. | 716/16 |
| 2004/0093578 A1 | * | 5/2004 | Nikitin et al. | 716/17 |

* cited by examiner

*Primary Examiner*—Stacy A Whitmore
(74) *Attorney, Agent, or Firm*—Casimer K. Salys; Dillon & Yudell LLP

(57) ABSTRACT

A method of designing a logic circuit includes providing a leaf cell having at least one transistor. The leaf is suitable for use as a 1-cell or a 0-cell in the logic circuit. A first array of abutting leaf cells is tiled using at least one 1-cell and at least one 0-cell to define at least one logical expression by the relative positions of the array cells. Length optimized interconnects are added to the array. Each length optimized interconnect terminates at a last leaf cell in the array to which the interconnect makes contact. The leaf cell may be a floating leaf cell in which any pair of abutting cells are electrically isolated from one another until the length optimized interconnects are added to the design. The leaf cell array likely includes a set of rows and a set of columns in which the leaf cells in each row and the set of columns each correspond to an input of the logical expression.

11 Claims, 4 Drawing Sheets

WIRE TRIMMED PROGRAMMABLE LOGIC ARRAY

BACKGROUND

1. Field of the Present Invention

The present invention generally relates to the field of circuit design and more specifically to the field of programmable logic array circuit design.

2. History of Related Art

Programmable logic arrays (PLA's) are well known in the field of integrated circuits. A PLA typically includes an array of substantially identical cells where each cell includes one or more transistors and one or more interconnect elements. These cells may be placed as desired within a device. The individual cells can then be connected in a desired fashion using a customized contact layer, interconnect (metal) layer, or both to achieve a desired logical function. This type of design is particularly suitable for generating certain logic functions including a sum of products type of function. Using this technique enables manufacturers to produce customized logic with quick turnaround because wafers can be processed to the final interconnect layer. From there, the final product can be produced with only a small amount of incremental processing.

PLA's are also desirable for their high density and high performance. PLA's are typically either pseudo-static PLA's or dynamic PLA's. Both of these technologies employ a single (NMOS) transistor in the basic cell. Relative to alternative technologies such as full CMOS logic, PLA's are faster and require less area. PLA technology does, however, tend to exhibit higher power consumption.

In a well known technique, PLA cells are "tiled" such that the boundaries of one cell abut the boundaries of all adjacent cells. In this configuration, interconnection between adjacent cells can be achieved by incorporating an interconnect or wire segment in the cell that traverses the cell from one boundary to the opposing boundary. When cells having such wire segment(s) are tiled, the wire segments of adjacent cells form a continuous interconnect. These wire segments are typically used to provide a common input signal to a set of cells or to carry an output from the set of cells.

Interconnection using abutting wire segments as described simplifies the design process by eliminating the interconnect as a variable. All that is required is to select the appropriate type of cell for placement in the tiled array to achieve the desired function. Interconnection among the tiled cells is assured by the abutting wire segments. While the simplicity inherent in interconnection by abutment designs is desirable, it leaves no room to optimize the design by, for example, customizing wire segment lengths depending upon the logic function that is implemented. It would be desirable to optimize the length of wire segments in a PLA to minimize parasitic capacitance associated with the interconnects and thereby achieve improved performance through reduced signal delay and lower power consumption.

SUMMARY OF THE INVENTION

The objective identified above is addressed by a method of designing a logic circuit according to the present invention. Initially a leaf cell having at least one transistor is designed and provided. The leaf is suitable for use as a 1-cell or a 0-cell in the logic circuit. A first array of abutting leaf cells is tiled using at least one 1-cell and at least one 0-cell to define at least one logical expression by the relative positions of the array cells. Length optimized interconnects are then added to the array. Each length optimized interconnect terminates at a last leaf cell in the array to which the interconnect makes contact. The leaf cell may be a floating leaf cell in which any pair of abutting cells are electrically isolated from one another until the length optimized interconnects are added to the design. The leaf cell array typically includes a set of rows and a set of columns. The cells in each row define a logical expression or function while each of the set of columns corresponds to an input of the logical expression. The length optimized interconnects may include length optimized column interconnects that selectively interconnect the leaf cells in a corresponding array column. In this embodiment, the column interconnects include true input interconnect and a complement input interconnect corresponding to each column in the array. Each true input contacts the gate electrode of the transistor of each 0-cell in the column and each complement input interconnect contacts the gate electrode of the transistor of each 1-cell in the column. Each true input signal terminates at the last 0-cell in the corresponding column and each complement input signal terminates at the last 1-cell in the corresponding column.

BRIEF DESCRIPTION OF THE DRAWINGS

Other objects and advantages of the invention will become apparent upon reading the following detailed description and upon reference to the accompanying drawings in which.

Figure 1:
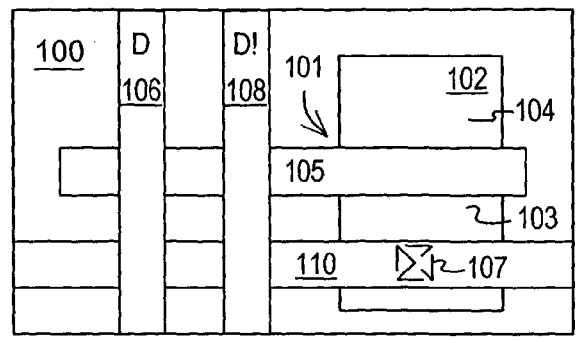
FIG. 1 is a layout diagram of a PLA leaf cell according to a conventional implementation.

While the invention is susceptible to various modifications and alternative forms, specific embodiments thereof are shown by way of example in the drawings and will herein be described in detail. It should be understood, however, that the drawings and detailed description presented herein are not intended to limit the invention to the particular embodiment disclosed, but on the contrary, the intention is to cover all modifications, equivalents, and alternatives falling within the spirit and scope of the present invention as defined by the appended claims.

DETAILED DESCRIPTION OF THE INVENTION

Generally speaking, the present invention encompasses a method for producing PLA circuits by leaf cell tiling in which the length of the interconnects are optimized based upon the implemented logical function. Input signals to and output signals from the "and plane" and "or plane" of a design are terminated at the point in the appropriate plane beyond which the signal is no longer required. In this manner, the average length of the interconnects in the PLA planes is shortened. The shorter interconnects have reduced parasitic capacitance that results in faster signal transitions (reduced delay) and lower power consumption.

Turning now to the drawings, FIG. 1 illustrates a conventional cell (also referred to as a leaf cell) 100 suitable for use in an interconnection-by-abutment design. In this implementation, leaf cell 100 includes a transistor 101, which is typically n-type or n-mos, formed by the transistor gate 105 traversing a source/drain region 102 as will be familiar to those in the field of MOS technology. A dielectric film disposed between transistor gate 105 and source/drain region 102 is not shown in FIG. 1.

PLA's typically include an AND plane that is suitable for generating logical AND functions (logical products such as A AND B or AB) and an OR plane for generating logical OR functions (logical sums such as X OR Y or X+Y). The logical products produced by the AND plane provide inputs to the OR plane. The logical sums produced by the OR plane represent a sum-of-products logical function. Leaf cell 100 as shown in FIG. 1 is typical of an AND plane leaf cell that receives an input signal D and its inverse D!. An OR plane leaf cell (not depicted) is similar to leaf cell 100, but somewhat simpler because it receives a single input.

Leaf cell 100 includes interconnect elements 106, 108, and 110. Interconnect elements 106 and 108 provide input signals to leaf cell 100 while interconnect element 110 represents a leaf cell output signal. Typically, the input signal 106 is the logical inverse of the input signal 108. This convention is indicated in FIG. 1 by the D and D! notation on signals 106 and 108 respectively. The connection between input signals 106 and 108 and transistor gate 105 determines the type and function of leaf cell 100. A typical PLA AND plane employs three basic leaf cells, a "0" cell in which the D signal 106 is connected to gate 105 (by an intermediate contact which is not shown), a "1" cell in which the D! signal 108 is connected to gate 105, and a "Don't Care" cell (also referred to as a "No Connect" or "NC" cell) in which neither input signal is connected to gate 105. The output signal 110, as seen, is connected to a drain side 103 of source/drain region 102 through a via or contact 107. Drain 103 of transistor 101 is typically precharged or tied to Vdd through a pull-up (or pull-down) impedance element while the source 104 is grounded. Unless the voltage of the input signal connected to gate 105 is higher than the threshold voltage of transistor 101 (i.e., unless the input signal is a logical "1" or "HIGH"), the output signal 110 will be a logical 1 or HIGH. The input signals 106 and 108 are typically implemented in an upper level metalization level of the fabrication process while the output signal 110 is typically implemented in a lower level metalization layer.

Figure 2:
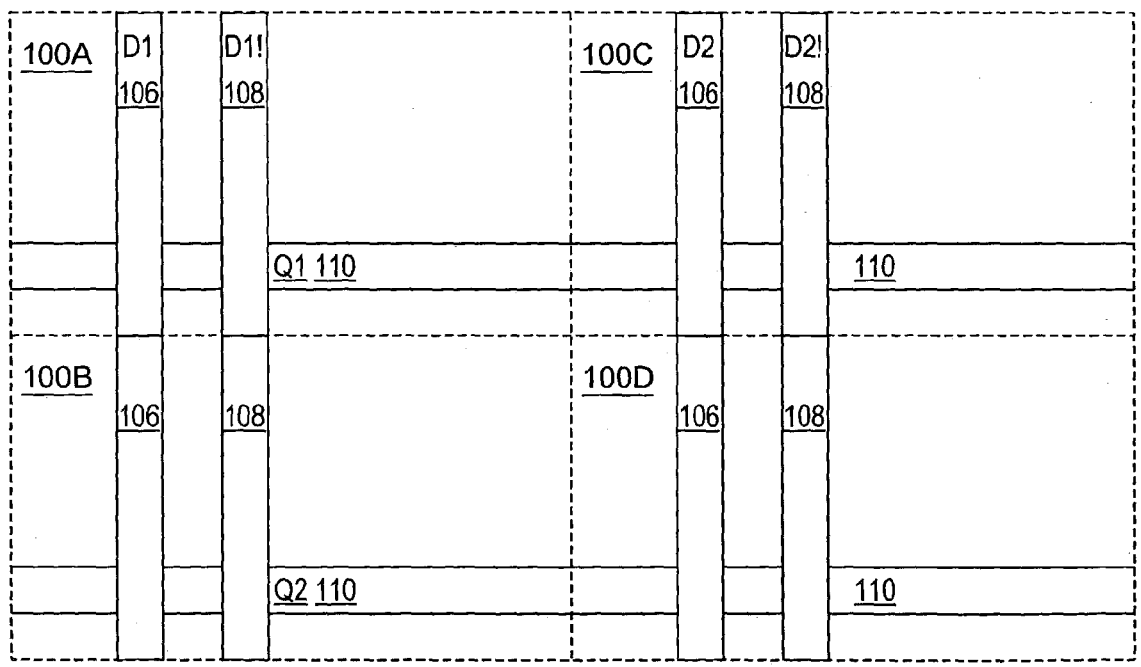
FIG. 2 is a tiled arrangement of the PLA cells of FIG. 1.

The significant aspect of leaf cell 100 for the purpose of the present invention is the dimensions of the interconnect signals 106, 108, and 110. Specifically, each of the interconnect signals 106, 108, and 110 extends from one boundary of leaf cell 100 to the opposing boundary. When a collection of leaf cells 100 is tiled such as in the 2×2 arrangement shown in FIG. 2 (where the transistor elements of each leaf cell are omitted for the sake of clarity), the interconnect signals 106, 108, and 110 form continuous interconnects that carry the respective signals across multiple leaf cells. Thus, input signals D1 and D1! are connected between leaf cell 100A and leaf cell 100B, input signals D2 and D2! are connected between leaf cells 100C and 100D, output signal Q1 is connected from leaf cell 100A to 100C, and output signal Q2 is connected from leaf cell 100B to 100D.

Figure 3A:
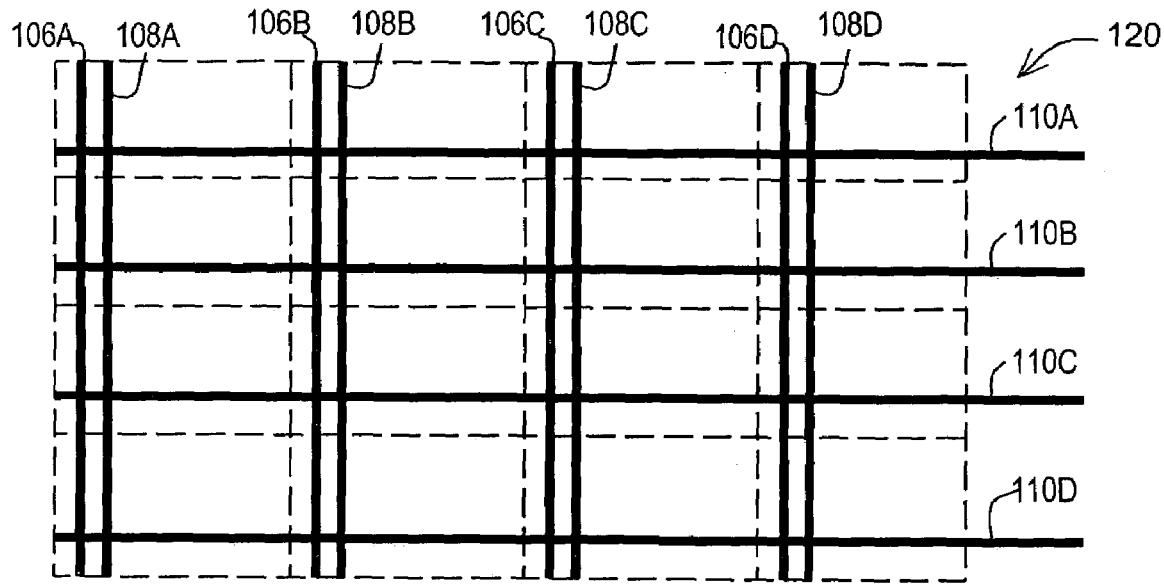
FIGS. 3A and 3B illustrate the interconnection by abutment design according to a conventional PLA design.
Figure 3B:
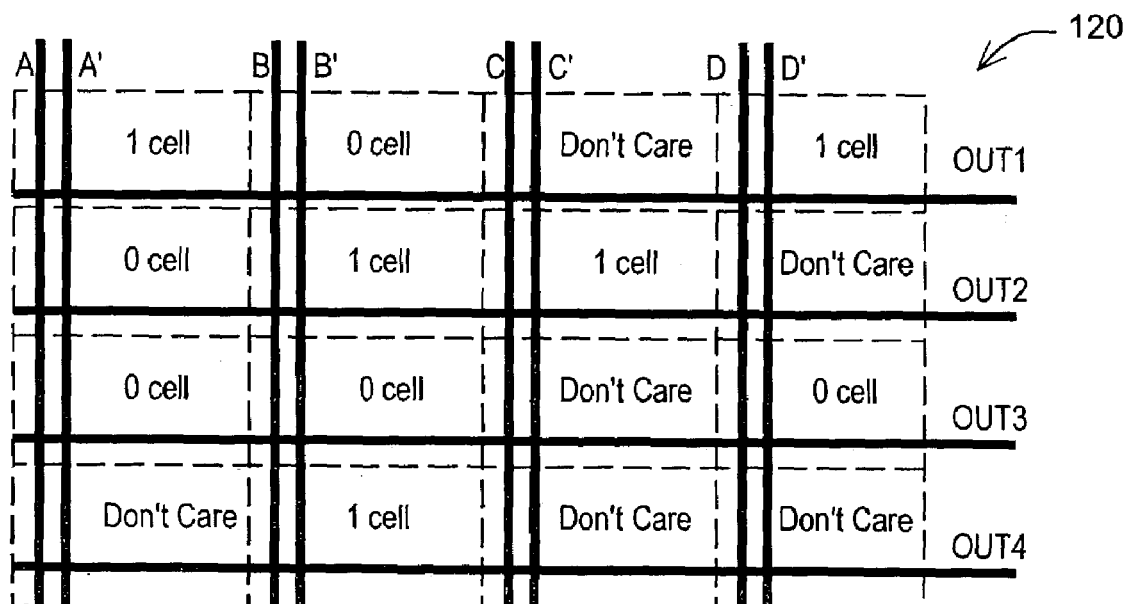

Referring now to FIG. 3A and FIG. 3B, selected portions of a PLA employing conventional interconnection by abutment are depicted for purposes of comparison with the PLA design contemplated by the present invention. The portion of PLA 120 depicted includes an AND plane having a 4×4 arrangement of leaf cells. In FIG. 3A, the input signals 106A through 106D (generically or collectively referred to as inputs signal(s) 106) and 108A through 108D (input signal(s) 108) and the output signals 110A through 110D are shown to emphasize the interconnection by abutment characteristic. Assuming that within each pair of input signals, input signals 106 and 108 are logical complements of each other, it will be appreciated that the depicted AND plane is suitable for producing four AND products (on signals 110A through 110D respectively) using any combination of the four input signals.

In FIG. 3B one of the possible implementations of the AND plane of FIG. 3A is shown. In this illustrative example, the desired AND products are achieved using one of the three leaf cells previously described in the discussion of FIG. 1. Specifically, leaf cells are tiled as shown to achieve four AND products. Remembering that a "1" cell represents a cell in which the complementary signal is connected to the transistor gate, a "0" is a cell in which the true signal is connected to the transistor gate, and that the output signal is precharged to "1" and pulled down to "0" only one of the transistor gates is biased to "1", it will be appreciated that, for example, output signal OUT1 is the logical AND product AB'D, OUT2 is the logical AND product A'BC, and so forth.

Inherent in the interconnect-by-abutment design of PLA 120 is the uniform length of the input signals 106 and 108 and the uniform length of output signals 110. Each of these signals traverses the 4×4 array from one boundary to an opposing boundary of the array. In many cases, the interconnects extend across cells in which they are not needed and, more significantly, extended beyond the last cell in which the corresponding signal is used. Input signal "A" in FIG. 3B, for example, is only used (connected to the transistor gate) in the "0" cells. Thus, input signal "A" need only extend to the last or lowest "0" cell in the column. Similarly, input signal A' need only extend to the last "1" cell in the column, which is the first cell. With respect to the output signals 110, which are oriented in the depicted illustration as providing an input to an OR plane (not depicted) that is to the right of the depicted AND plane, they need only extend as far as the left-most cell that is used (i.e., is not an NC cell).

Figure 4A:
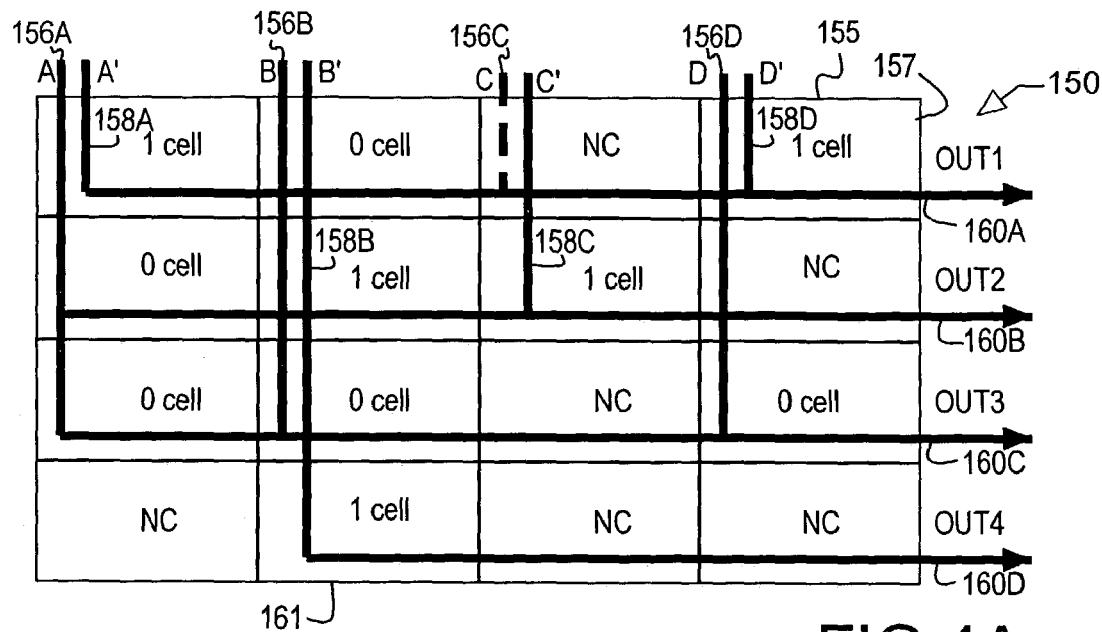
FIGS. 4A and 4B illustrate length optimized interconnects in a PLA design according to one embodiment of the present invention.
Figure 4B:
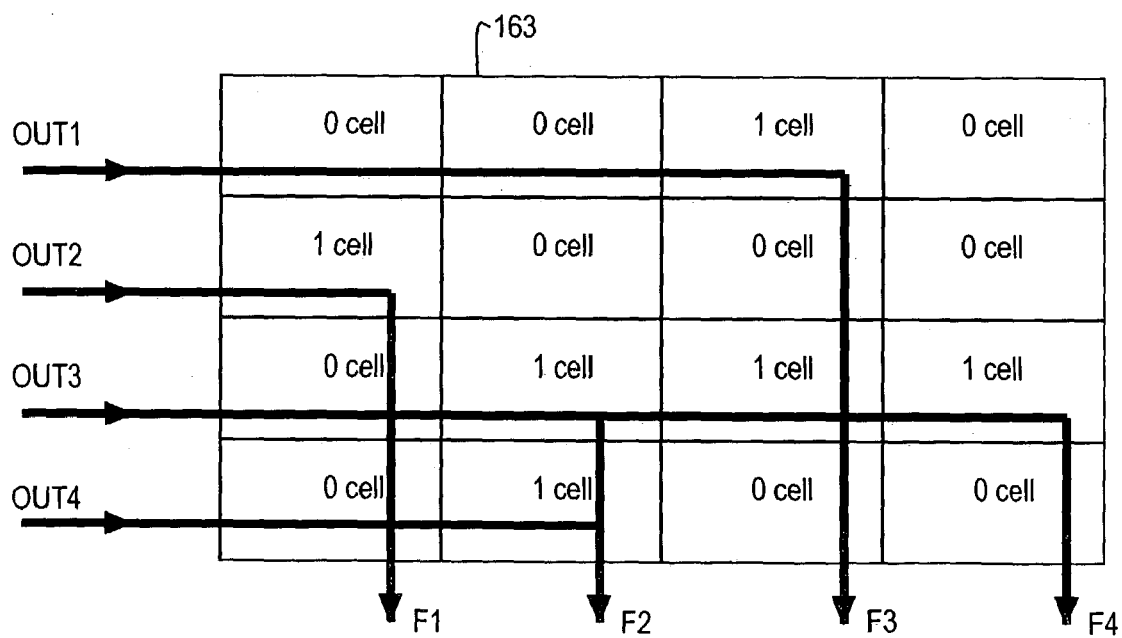

The present invention recognizes the presence of interconnects that are frequently unnecessarily long because of the use of interconnect-by-abutment leaf cells. Referring to FIGS. 4A and 4B, selected elements of a PLA 150 according to one embodiment of the present invention are depicted. PLA 150 includes an AND plane array 161 of abutting or tiled cells. In the depicted embodiment, each row of array 161 defines a logical expression (e.g., ABC!D) while each column corresponds to a particular input. Thus, the 4×4 array 161 is capable of generating four logical expressions of as many as four input variables (and their complements).

The tiled cells include a "1" cell, a "0" cell, and an "NC" cell. These different cells are preferably derived from a common leaf cell design and differentiated by their interconnect-to-transistor contacts. Specifically, as described above, a complement input signal interconnect contacts the cell's transistor in a "1" cell, a true input signal interconnect contacts the cell's transistor in a "0" cell, and neither of the interconnects contacts the transistor gate in an "NC" cell. The relative positions of the "1" cells, "0" cells, and "NC" cells in each row define the logical expression corresponding to the row.

In the depicted embodiment, AND plane 161 is functionally equivalent to the AND plane of PLA 120 shown in FIG. 3A. In PLA 150, however, the interconnect signals are length-optimized based on the logical function implemented, the orientation of the input and output signals and the positioning of the AND and OR planes. Thus, as depicted in FIG. 4A, in which the inputs are vertically or column oriented and the outputs of the AND plane are horizontally oriented and provide inputs to an OR plane array 163 (depicted in FIG. 4B) that is to the right of AND plane array 161, each true input signal 156A though 156D and each complementary input signal 158A through 158D extends from a top boundary 155 of AND plane array 161 to the last cell in which the corresponding signal is used (i.e., the last cell to which the interconnect contacts the cell's transistors). Similarly, the output signals 160A through 160D extend back from the right boundary 157 to the last (left most) cell to which the output signal is connected. Input signal 158A, for example, is a complementary logic signal that is only used in the "1" cells of AND plane array 161. Because the only "1" cell in the first column of the depicted AND plane is located in the first row, input signal 158A is terminated at the first cell. In an analogous manner, each of the input signals 156, 158 and output signals 110 is length optimized to terminate at the last cell in which the signal is required.

FIG. 4B depicts an OR plane array 163 of PLA 150 to emphasize the extension of the length optimized interconnect concept to the OR plane. The OR plane array 163 is characterized by a single input signal for each cell (the input being one of the outputs of the AND plane) and the use of just two different types of cells. In OR plane 163, a "1" cell represents a cell to which the corresponding input signal is connected to the transistor gate while a "0" cell is a cell in which the transistor gate is not connected. A "0" cell in the OR plane is, therefore, analogous to an NC cell in the AND plane. Length optimization of the signals in the OR plane is achieved by extending the horizontally oriented output signals received from the AND plane only to the right most "1" cell and extending the vertically oriented OR plane output signals F1 through F4 back to the top most "1" cell.

While FIG. 4A and FIG. 4B are drawn with particular orientations to illustrate the invention, it will be appreciated that illustrated orientations are implementation specific and that the general concept of length optimizing the interconnect signals within the AND plane and OR plane of a PLA cell applies equally to other orientations of signals and plane positions.

Figure 5:
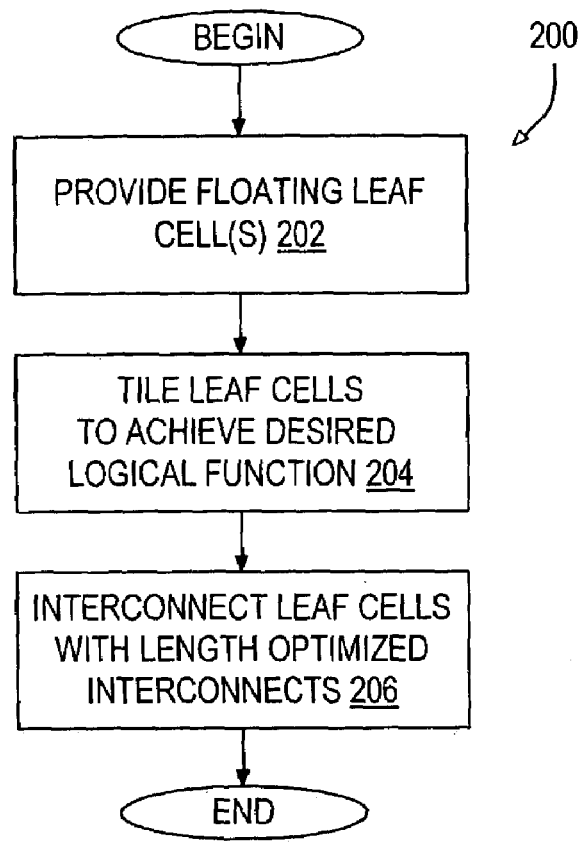
FIG. 5 is a flow diagram of a method of designing an integrated circuit using length optimized interconnects according to one embodiment of the present invention.
Figure 6:
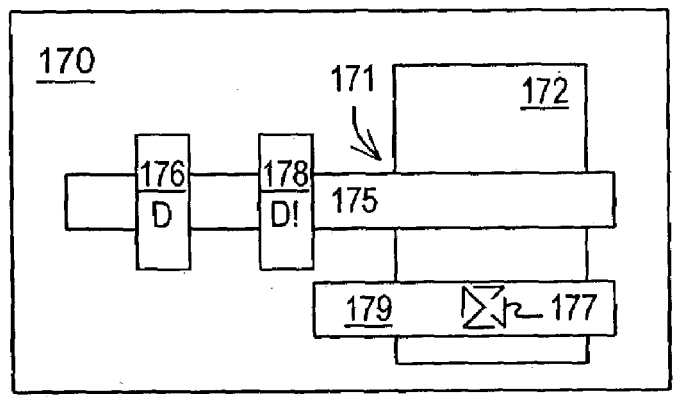
FIG. 6 is a circuit diagram of a floating leaf cell suitable for use in the length optimized interconnect PLA according to one embodiment of the present invention.

The PLA 150 depicted in FIG. 4A and FIG. 4B is achieved according to one embodiment by employing an integrated circuit design methodology as conceptually illustrated by the flow diagram of FIG. 5. In the depicted design method 200, a set of "floating" leaf cells are provided (block 202) to a designer. Referring momentarily to FIG. 6, an example of a possible floating leaf cell 170 suitable for use as a "1" cell, a "0" cell, or an "NC" cell in the present invention is depicted. In the depicted example, floating leaf cell 170 includes the same functional elements as the leaf cell 100 depicted in FIG. 1. Thus, floating leaf cell 170 includes a single transistor 171, which is typically n-type, defined by a source/drain region 172 and a transistor gate 175. In lieu of the wire segments 106, 108, and 110 of the leaf cell 100 of FIG. 1, however, floating leaf cell 170 according to the depicted embodiment includes floating interconnect input elements 176 and 178 and a floating interconnect output element 179. The term "floating" is used in the present application to emphasize that, if floating cells 170 were tiled together with the boundaries of each cell abutting the boundaries of as many as four neighboring cells, all of the cells would be floating in the sense that there would be no interconnection among them because the interconnect elements do not extend to the leaf boundaries. Thus, in a tiled array of abutting floating leaf cells 170, any pair of abutting leaf cells are electrically isolated from each other, until interconnects (specifically, length optimized interconnects) are subsequently added.

Thus, returning to the flow diagram of FIG. 5, the present invention includes a process of tiling (block 204) at least one array of the floating leaf cells 170 to achieve a desired logical function. This tiling process is analogous to the tiling process that occurs in a conventional design method. Specifically, the tiling process refers to the arrangement of "1" cells, "0" cells, and "NC" cells, all derived from floating leaf cell 170, to achieve a desired function and this arrangement does not change because of the use of floating point leaf cells. In the design method 200 according to the present invention, however, it is necessary to add an additional design step in which the tiled cells are interconnected (block 206) by adding length optimized interconnects to the design.

The interconnection step according to the present invention may be done algorithmically following the tiling step. For each interconnect, a design algorithm can determine where to terminate each interconnect based on the placement and type of leaf cells. In the orientation of FIG. 4A, for example, the interconnection algorithm can determine the termination point of each true data signal by determining the position of the "0" cells and ensuring that the true signals extend to reach the lower most "0" cell, but no further. Using a similar algorithm for the other interconnects, the interconnection algorithm defines the termination point of each interconnect in the PLA and fills in the tiled layout according to the determined termination points of the interconnects. The effect of length optimizing each interconnect in the design will be to reduce parasitic capacitance inherent in every interconnect. The reduced stray capacitance will, in turn, result in a reduction of the power required to charge this stray capacitance whenever an interconnect is asserted and thereby reduce overall power consumption without sacrificing the density and performance benefits of a PLA.

It will be apparent to those skilled in the art having the benefit of this disclosure that the present invention contemplates a circuit and method employing length optimized interconnects for reducing power consumption in a PLA. It is understood that the form of the invention shown and described in the detailed description and the drawings are to be taken merely as presently preferred examples. It is intended that the following claims be interpreted broadly to embrace all the variations of the preferred embodiments disclosed.

What is claimed is:

1. A method of designing a logic circuit, the method comprising:

providing a leaf cell including at least one transistor, the leaf cell being suitable for use as a 1-cell or a 0-cell;

tiling a first array of abutting leaf cells using at least one 1-cell and at least one 0-cell to define at least one logical expression by the relative positions of the array cells, wherein the first array is characterized by a set of rows and a set of columns, and wherein leaf cells in the set of rows define the at least one logical expression, and wherein the set of columns corresponds to inputs of the at least one logical expression; and adding length optimized column interconnects that selectively interconnect leaf cells in an array column, wherein column interconnects that correspond to a true input contact a gate electrode of the transistor of each 0-cell in the array column, and wherein column interconnects that correspond to a complement input contact a gate electrode of the transistor of each 1-cell in the array column, such that each true input signal terminates at a last 0-cell in a column and each complement input signal terminates at a last 1-cell in a column.

2. The method of claim 1, wherein providing the leaf cell is further characterized as providing a floating leaf cell, wherein any pair of abutting floating leaf cells are electrically isolated from one another until the the length optimized column interconnects are added.

3. The method of claim 1, further comprising adding length optimized row interconnects that selectively interconnect leaf cells in an array row.

4. A method of designing a logic circuit, the method comprising:
providing a leaf cell that includes at least one transistor, the leaf cell being suitable for use as a 1-cell or a 0-cell;
tiling a first array of abutting leaf cells using at least one 1-cell and at least one 0-cell to define at least one logical expression by the relative positions of the array cells;
adding length optimized interconnects to the tiled array, wherein each length optimized interconnect terminates at a last leaf cell in an array to which the interconnect makes contact; and
tiling a second array of leaf cells, wherein output signals from the first array provide input signals to the second array, wherein the first array is characterized as an AND plane and the second array is characterized as an OR plane, and wherein the interconnects in the OR plane terminate at the last cell to which they are connected.

5. A programmable logic array, comprising:
a first logic plane comprising an array of abutting cells including at least one 1-cell and at least one 0-cell, wherein cells in each row of the array define a corresponding logic function; and
a first set of length optimized interconnects selectively interconnecting cells in the first logic plane, wherein each length optimized interconnect terminates at a last cell in a corresponding column to which the length optimized interconnect makes contact, and wherein the first set of length optimized interconnects includes a first set of length optimized column interconnects that selectively connects cells in columns of the first logic plane, and wherein the first set of length optimized column interconnects further includes a true interconnect and a complement interconnect for each column of the array, wherein each true interconnect terminates at a last 0-cell in a column and the complement interconnect terminates at a last 1-cell in a column.

6. The logic array of claim 5, further comprising a second logic plane comprising a second array of abutting cells, wherein the outputs of the first logic plane provide inputs to the second logic plane, and wherein the second logic plane includes a second set of length optimized interconnects, each terminating at a last cell in the second logic plane to which the interconnect makes contact.

7. The logic array of claim 5, wherein each cell includes a single n-type transistor.

8. A computer readable medium encoded with computer executable instructions for designing a programmable logic array, the computer readable medium comprising:
computer code for defining a leaf cell suitable for use as a 1-cell or a 0-cell in the logic array;
computer code for arranging a set of leaf cells in a first array of multiple rows and multiple columns, wherein leaf cells in each row define a corresponding logical expression, and wherein each column corresponds to an input of the corresponding logical expression, and wherein each leaf cell abuts at least one other leaf cell; and
computer code for selectively connecting the leaf cells in an array column through the use of length optimized column interconnects, wherein column interconnects corresponding to each column include a true input interconnect and a complement input interconnect, wherein the true input interconnect contacts a gate electrode of the transistor of each 0-cell in the column and the complement input interconnect contacts a gate electrode of the transistor of each 1-cell in the column, such that each true input signal terminates at a last 0-cell in a column and each complement input signal terminates at a last 1-cell in a column.

9. The computer readable medium of claim 8, wherein the computer code for defining the leaf cell is further characterized as computer code for defining a floating leaf cell, wherein any pair of abutting floating leaf cells are electrically isolated from one another until the length optimized interconnects are added.

10. The computer readable medium of claim 8, further comprising computer code for adding length optimized row interconnects selectively interconnecting the leaf cells in an array row.

11. The computer readable medium of claim 8, further comprising computer code for tiling a second array of leaf cells, wherein output signals from the first array provide inputs signals to the second array, wherein the first array is characterized as an AND plane and the second array is characterized as an OR plane.

* * * * *